United States Patent
Jocham et al.

[11] Patent Number: 6,097,599
[45] Date of Patent: Aug. 1, 2000

[54] CONNECTOR

[75] Inventors: Reinhold Jocham; Harald Schondelmaier, both of Hechingen, Germany

[73] Assignee: Robert Bosch GmbH, Stuttgart, Germany

[21] Appl. No.: 09/155,735

[22] PCT Filed: Jan. 9, 1997

[86] PCT No.: PCT/DE97/00026

§ 371 Date: Oct. 5, 1998

§ 102(e) Date: Oct. 5, 1998

[87] PCT Pub. No.: WO98/01014

PCT Pub. Date: Jan. 8, 1998

[30] Foreign Application Priority Data

Jun. 27, 1996 [DE] Germany ............... 196 25 755

[51] Int. Cl.⁷ ................................. H05K 7/20
[52] U.S. Cl. .............. 361/704; 165/78; 165/80.5; 165/167; 165/104.14; 165/80.3; 257/722; 174/16.3
[58] Field of Search ................. 361/702–710, 361/713; 174/16.3; 165/78, 80.2, 80.3, 80.4, 80.5, 104.14, 165; 257/706–727, 675; 363/141, 144, 48; 403/220, 265, 268

[56] References Cited

U.S. PATENT DOCUMENTS

| | | |
|---|---|---|
| 3,871,069 | 3/1975 | Grieb . |
| 4,799,541 | 1/1989 | Buna et al. .................... 165/78 |
| 4,802,532 | 2/1989 | Dawes et al. ................. 165/80.3 |
| 4,840,222 | 6/1989 | Lakin et al. . |

FOREIGN PATENT DOCUMENTS

| | | |
|---|---|---|
| 42 22 838 A1 | 3/1993 | Germany . |
| 410061727 | 8/1996 | Japan .............. F16G 13/06 |

*Primary Examiner*—Leo P. Picard
*Assistant Examiner*—Michael Datskovsky
*Attorney, Agent, or Firm*—Michael J. Striker

[57] ABSTRACT

A connector is proposed for a mechanical and thermal coupling of components (2, 3), wherein a heat-conducting pin (4) is arranged on one of the components (3), while on the other component (2) situated opposite the connecting point, a heat conducting sleeve (5) is arranged, wherein the sleeve (5) is slipped onto the pin (4) by means of a press fit. The sleeve (5), after being slipped on over the resilient ring (6), rests against a shoulder (8) of the pin (4).

4 Claims, 1 Drawing Sheet

CONNECTOR

PRIOR ART

The invention relates to a connector for a mechanical and thermal coupling of componentry as defined in the preamble of the main claim.

Connectors for componentry of an electrical device are already known from DE-OS 42 22 838, in which power elements, which create waste heat, are arranged on the printed circuit board supporting an electronic control device. In order to discharge the waste heat of the power elements of this componentry, a heat conducting layer on the printed circuit board is also in contact with portions of the housing, so that the housing can also be considered as cooling element. In this case, however, only a contact of a separate printed circuit board with a housing is described, without taking into account the mechanical and thermal problems in contacting larger componentry.

ADVANTAGES OF THE INVENTION

The connector in accordance with the invention for a mechanical and thermal coupling of componentry with the characterizing features of claim 1 is particularly advantageous, in that a good thermal coupling is assured with a flexible connector and separation possibility of the componentry. By means of the resilient stop of the sleeve against a shoulder of a pin, production tolerances of the componentry can be compensated without impairing the thermal contact. Even in the case of different temperature increases or different coefficients of thermal expansion of the componentry, a good mechanical and thermal contact remains, since a resilient ring makes compensation of this tolerance possible.

Advantageous embodiments are recited in the dependent claims.

DRAWINGS

An advantageous exemplary embodiment of the connector in accordance with the invention is described in the drawings. Shown are in:

FIG. 1, in the upper half, a top view and in the lower half, a sectional view of a pin and a sleeve with a resilient ring as connector, and in FIG. 2, a detailed, perspective, schematic diagram of the connector.

DESCRIPTION OF THE EXEMPLARY EMBODIMENT

Figure 1:
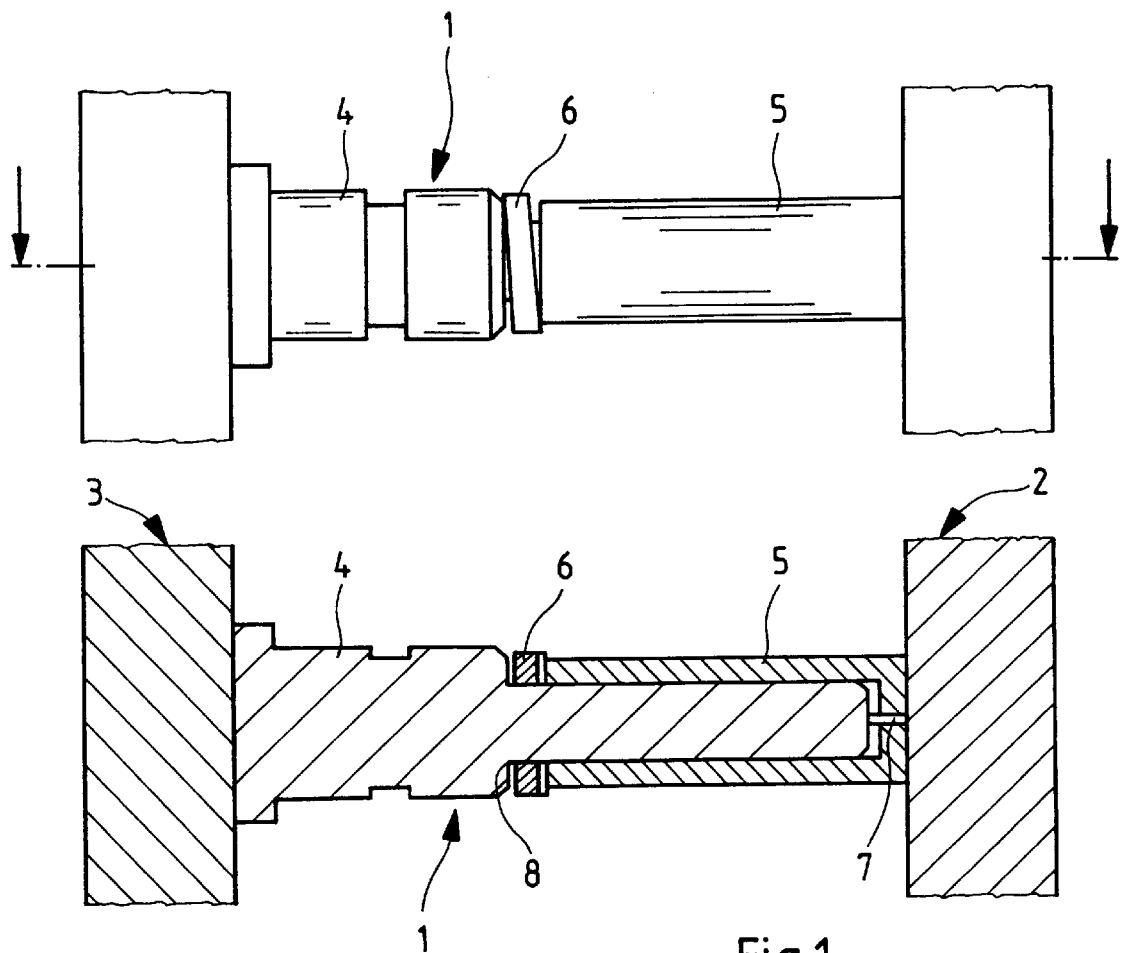

Connecting elements 1 arranged between two components 2 and 3 and intended to create a mechanical and thermal connection between these components 2 and 3 are shown in FIG. 1. A pin 4 is held, either by means of glue or by mechanical contact pressure, on the component 3, and a sleeve 5 with an axial slit is fastened by similar means as the pin 4 on the component 2.

Figure 2:
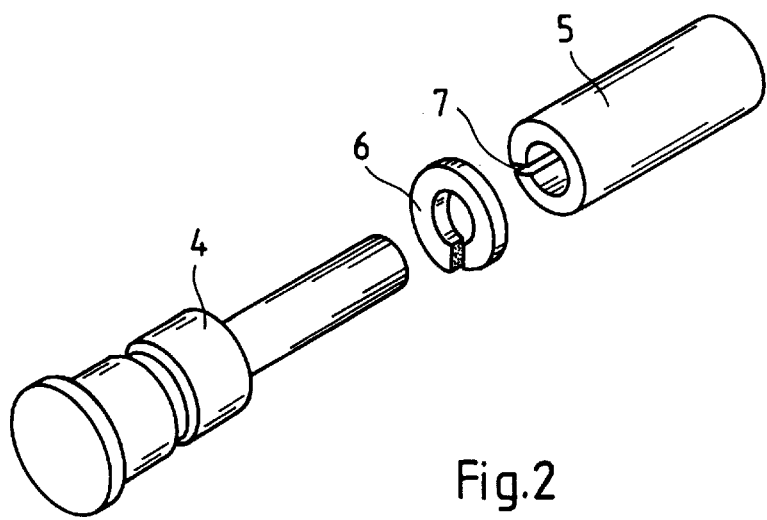

The sectional drawing in the lower portion of FIG. 1 shows the position of these parts, in particular also that of a resilient ring 6 at a shoulder 8 of the pin 4. FIG. 2 shows a perspective representation of parts 4, 5 and 6, wherein an axial slit 7 in the sleeve 5 is also shown.

The above described drawing figures distinctly demonstrate how a good mechanical and thermal contact between the components 2 and 3 can be made after slipping the sleeve 5 onto the pin 4, and thus compensating different thermal expansions and production tolerances of the components 2 and 3.

We claim:

1. A connector for a mechanical and thermal coupling of components (2,3), characterized in that a heat conducting pin (4) is arranged on one of the components (3) while on the other component (2), situated opposite the connecting point, a heat conducting sleeve (5) is arranged, wherein the sleeve (5) can be slipped onto the pin (4) by means of an press fit, and in that the sleeve (5), after being slipped on over a resilient ring (6), rests against a shoulder (8) of the pin (4).

2. The connector in accordance with claim 1, characterized in that the pin (4) and/or the sleeve (5) are glued together with the surface of the respective component (2, 3).

3. The connector in accordance with claim 1, characterized in that the pin (4) and the sleeve (5) are made of metal.

4. The connector in accordance with claim 1, characterized in that the sleeve (5) at least partially has an axial slit (7).

* * * * *